United States Patent
Kim et al.

(10) Patent No.: US 8,456,212 B2
(45) Date of Patent: Jun. 4, 2013

(54) DUTY CORRECTING CIRCUIT, DELAY-LOCKED LOOP CIRCUIT INCLUDING THE CIRCUIT, AND METHOD OF CORRECTING DUTY

(75) Inventors: Woo-Seok Kim, Suwon-si (KR); Do-Hyung Kim, Seoul (KR); Tae-Kwang Jang, Seoul (KR); Se-Hyung Jeon, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 118 days.

(21) Appl. No.: 13/050,652

(22) Filed: Mar. 17, 2011

(65) Prior Publication Data
US 2011/0291726 A1    Dec. 1, 2011

(30) Foreign Application Priority Data
May 28, 2010    (KR) .................. 10-2010-0050514

(51) Int. Cl.
*H03K 3/017*    (2006.01)
(52) U.S. Cl.
USPC .................. 327/175; 327/172

(58) Field of Classification Search
USPC .................. 327/172–175
See application file for complete search history.

(56) References Cited

U.S. PATENT DOCUMENTS

| 6,982,581 | B2 | 1/2006 | Dosho et al. | |
| 7,119,602 | B2 * | 10/2006 | Davis | 327/415 |
| 7,705,647 | B2 * | 4/2010 | Dai et al. | 327/175 |

FOREIGN PATENT DOCUMENTS

| JP | 2004-187200 | 7/2004 |
| KR | 1020000061744 | 10/2000 |
| KR | 1020090048888 | 5/2009 |

* cited by examiner

*Primary Examiner* — An Luu
(74) *Attorney, Agent, or Firm* — F. Chau & Associates, LLC

(57) ABSTRACT

A duty correcting circuit includes a duty steerer circuit, a differential clock generator, and a charge pump circuit. The duty steerer circuit corrects a duty cycle of an input clock signal in response to a duty control signal and generates an output clock signal. The differential clock generator generates two internal clock signals having a phase difference of 180° from each other based on the output clock signal. The charge pump circuit performs a charge pump operation in a differential mode in response to the internal clock signals to generate a duty control signal.

20 Claims, 7 Drawing Sheets

DUTY CORRECTING CIRCUIT, DELAY-LOCKED LOOP CIRCUIT INCLUDING THE CIRCUIT, AND METHOD OF CORRECTING DUTY

CROSS-REFERENCE TO RELATED APPLICATION

This application claims priority under 35 U.S.C. §119 to Korean Patent Application No. 10-2010-0050514 filed on May 28, 2010, the disclosure of which is incorporated by reference in its entirety herein.

BACKGROUND

1. Technical Field

Embodiments of the inventive concept relate to a duty correcting circuit and, more particularly, to a duty correcting circuit including a charge pump circuit and a method of correcting a duty.

2. Discussion of Related Art

Circuits of semiconductor devices may operate in response to clock signals. The clock signals may be generated in synchronization with an externally provided clock signal. However, the duty cycle of the generated clock signals may be incorrect. For example, when the duty cycle is incorrect, various functions of the semiconductor device may not operate properly.

SUMMARY

At least one embodiment of the inventive concept provides a duty correcting circuit that may prevent a mismatch between PMOS and NMOS transistors of a charge pump circuit in the duty correcting circuit. In embodiments of the inventive concept, the duty correcting circuit may be used to adjust an output signal of a delay-locked loop (DLL) circuit or a phase-locked-loop circuit (PLL). In further embodiments of the invention concept, the duty correcting circuit may be used to provide a clock signal to a logical circuit of a semiconductor memory. At least one embodiment of the inventive concept provides a method of correcting a duty, which may prevent a mismatch between PMOS and NMOS transistors of a charge pump circuit.

According to an exemplary embodiment of the inventive concept, a duty correcting circuit includes a duty steerer circuit, a differential clock generator, and a charge pump circuit. The duty steerer circuit corrects a duty cycle of an input clock signal in response to a duty control signal and generates an output clock signal. The differential clock generator generates a first internal clock signal and a second internal clock signal having a phase difference of 180° from each other based on the output clock signal. The charge pump circuit performs a charge pump operation in a differential mode in response to the first and second internal clock signals to generate the duty control signal.

The duty correcting circuit may maintain a duty cycle of 50% when an up current flowing through a PMOS transistor of the charge pump circuit is equal to a down current flowing through an NMOS transistor of the charge pump circuit.

The duty steerer circuit may include a driver and a duty steerer. The driver may pull up or pull down an output node in response to the input clock signal. The duty steerer may add an offset to a voltage signal of the output node in response to the duty control signal. The duty steerer may increase or decrease a driving current of the output node to steer the duty of the output clock signal.

The duty steerer may adjust the input clock signal such that a rising edge of the output clock signal occurs at an earlier point in time and a falling edge of the output clock signal occurs at a later point in time, when the input clock signal has a duty cycle of less than 50%.

The duty steerer may adjust the input clock signal such that a rising edge of the output clock signal occurs at a later point in time and a falling edge of the output clock signal occurs at an earlier point in time, when the input clock signal has a duty cycle of more than 50%.

The driver may include a PMOS transistor and an NMOS transistor. The PMOS transistor may have a gate to which the input clock signal is applied, a source connected to a power supply voltage, and a drain connected to the output node. The NMOS transistor may have a gate to which the input clock signal is applied, a source connected to a ground voltage, and a drain connected to the output node.

The duty steerer may include a PMOS transistor and an NMOS transistor. The PMOS transistor may have a gate to which the duty control signal is applied, a source connected to a power supply voltage, and a drain connected to the output node. The NMOS transistor may have a gate to which the duty control signal is applied, a source connected to a ground voltage, and a drain connected to the output node.

The duty steerer circuit may further include an inverter configured to invert the phase of the voltage signal of the output node to generate the output clock signal.

The differential clock generator may include a buffer and an inverter. The buffer may buffer the output clock signal to generate the first internal clock signal. The inverter may invert the phase of the output clock signal to generate the second internal clock signal.

The charge pump circuit may include a first differential amplifier, a second differential amplifier, a third differential amplifier, and a charge storage unit. The first differential amplifier, which may have a positive voltage gain, may amplify a voltage difference between the first internal clock signal and the second internal clock signal to generate a first amplified voltage signal, and transmit the first amplified voltage signal to a first node (of the charge pump). The second differential amplifier, which may have a negative voltage gain, may amplify the voltage difference between the first internal clock signal and the second internal clock signal to generate a second amplified voltage signal, and transmit the second amplified voltage signal to a second node (of the charge pump). The third differential amplifier may amplify the voltage difference between the first amplified voltage signal and the second amplified voltage signal to generate the duty control signal. The charge storage unit may perform charge and discharge operations in response to the duty control signal. The charge storage unit may include a capacitor.

The duty correcting circuit may further include a differential-to-single converter configured to perform a differential-to-single conversion of the first internal clock signal and the second internal clock signal to generate a third internal clock signal.

According to an exemplary embodiment of the inventive concept, a DLL circuit includes a DLL and a duty correcting circuit. The DLL generates a first internal clock signal in synchronization with an external clock signal. The duty correcting circuit corrects a duty cycle of the first internal clock signal. The duty correcting circuit includes a duty steerer circuit, a differential clock generator, and a charge pump circuit.

The duty steerer circuit corrects a duty cycle of an input clock signal in response to a duty control signal and generates an output clock signal. The differential clock generator generates the first internal clock signal and a second internal clock signal having a phase difference of 180° from each other based on the output clock signal. The charge pump circuit performs a charge pumping operation in a differential mode in response to the first and second internal clock signals to generate the duty control signal.

According to an exemplary embodiment of the inventive concept, a semiconductor device includes a DLL circuit and an internal circuit. The DLL circuit generates an internal clock signal having a corrected duty cycle and synchronized with an external clock signal. The internal circuit operates in response to the internal clock signal.

The DLL circuit includes a duty correcting circuit configured to correct a duty cycle of a first internal clock signal corresponding to the external clock signal. The duty correcting circuit includes a duty steerer circuit, a differential clock generator, and a charge pump circuit.

The duty steerer circuit corrects the duty cycle of the input clock signal in response to a duty control signal to generate an output clock signal. The differential clock generator generates a first internal clock signal and a second internal clock signal having a phase difference of 180° from each other based on the output clock signal. The charge pump circuit performs a charge pumping operation in a differential mode in response to the first internal clock signal and the second internal clock signal to generate the duty control signal.

According to an exemplary embodiment of the inventive concept, a method of correcting a duty includes: correcting a duty cycle of an input clock signal in response to a duty control signal to generate an output clock signal, generating a first internal clock signal and a second internal clock signal having a phase difference of 180° from each other based on the output clock signal, and performing a charge pumping operation in a differential mode in response to the first internal clock signal and the second internal clock signal to generate the duty control signal.

The correction of the duty cycle of the input clock signal may include: pulling up or pulling down an output node in response to the input clock signal and adding an offset to a voltage signal of the output node in response to the duty control signal.

When the input clock signal has a duty cycle of less than 50%, the correcting may include: adjusting the input clock signal such that a rising edge of the output clock signal occurs at an earlier point in time and a falling edge of the output clock signal occurs at a later point in time.

When the input clock signal has a duty cycle of more than 50%, the correcting may include: adjusting the input clock signal such that a rising edge of the output clock signal occurs at a later point in time, and a falling edge of the output clock signal occurs at an earlier point in time.

The generation of the duty control signal may include: amplifying a voltage difference between the first internal clock signal and the second internal clock signal to generate a first amplified voltage signal using a first differential amplifier having a positive voltage gain, amplifying the voltage difference between the first internal clock signal and the second internal clock signal to generate a second amplified voltage signal using a second differential amplifier having a negative voltage gain, and amplifying a voltage difference between the first amplified voltage signal and the second amplified voltage signal to generate the duty control signal.

According to an exemplary embodiment of the inventive concept, a semiconductor device includes a logic circuit, a duty steerer circuit, a differential clock generator, a charge pump circuit, and a differential-to-single converter. The duty steerer circuit is configured to correct a duty cycle of an input clock signal in response to a duty control signal to generate a first internal clock signal. The differential clock generator is configured to generate a second internal clock signal and a third internal clock signal having a phase difference of 180° from each other based on the first internal clock signal. The charge pump circuit is configured to perform a charge pump operation in a differential mode in response to the second and third internal clock signals to generate the duty control signal. The differential-to-single converter is configured to perform a differential-to-single conversion on the second internal clock signal and the third internal clock signal to generate a fourth internal clock signal, and provide the fourth internal clock signal to a logic circuit.

BRIEF DESCRIPTION OF THE DRAWINGS

Exemplary embodiments of the inventive concept are described in further detail below with reference to the accompanying drawings in which like reference characters may refer to the same parts throughout the different views. The drawings are not necessarily to scale. In the drawings.

DETAILED DESCRIPTION

Exemplary embodiments of the present inventive concept will now be described more fully with reference to the accompanying drawings. The inventive concept should not be construed as limited to the embodiments set forth herein.

It will be understood that when an element or layer is referred to as being "on," "connected to" or "coupled to" another element or layer, it can be directly on, connected or coupled to the other element or layer or intervening elements or layers may be present.

The respective steps described in the present inventive concept may be performed in a specified order, substantially at the same time, or in reverse order.

Hereinafter, exemplary embodiments of the inventive concept will be described with reference to the accompanying drawings.

Figure 1:
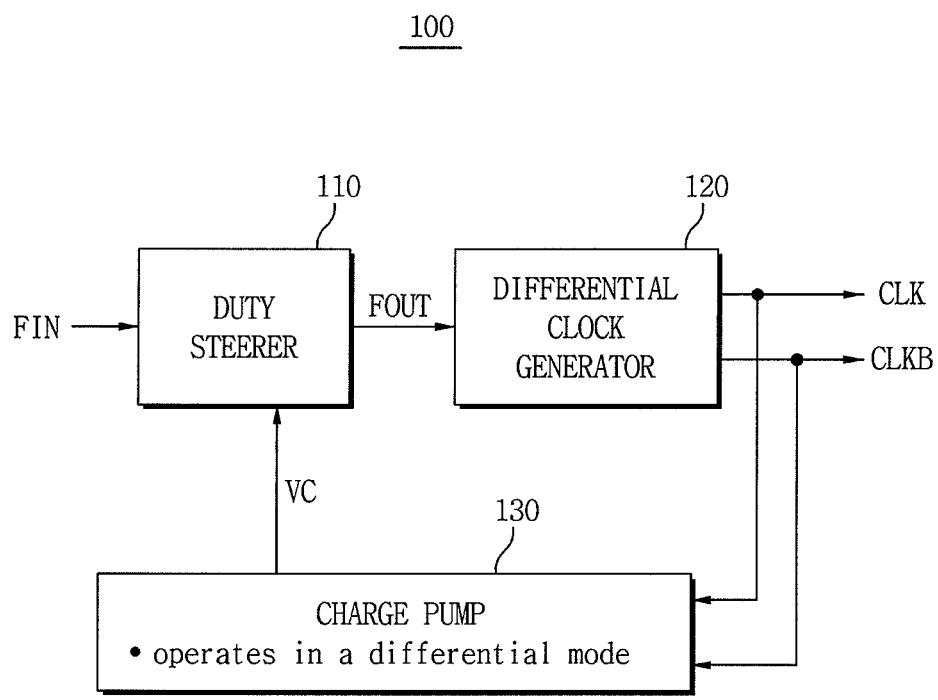
FIG. 1 is a block diagram of a duty correcting circuit according to an exemplary embodiment of the inventive concept.

FIG. 1 is a block diagram of a duty correcting circuit according to an exemplary embodiment of the inventive concept. Referring to FIG. 1, a duty correcting circuit 100 may include a duty steerer circuit 110, a differential clock generator 120, and a charge pump circuit 130.

The duty steerer circuit 110 may correct a duty cycle of an input clock signal FIN in response to a duty control signal VC and generate an output clock signal FOUT. The differential clock generator 120 may generate a first internal clock signal CLK and a second internal clock signal CLKB having a phase difference of 180° therebetween based on the output clock signal FOUT. The charge pump circuit 130 may perform a charge pumping operation in a differential mode in response to the first and second internal clock signals CLK and CLKB and generate the duty control signal VC.

The duty correcting circuit 100 of FIG. 1 may maintain a duty cycle of 50% when an up current flowing through a PMOS transistor is equal to a down current flowing through an NMOS transistor.

Figure 2:
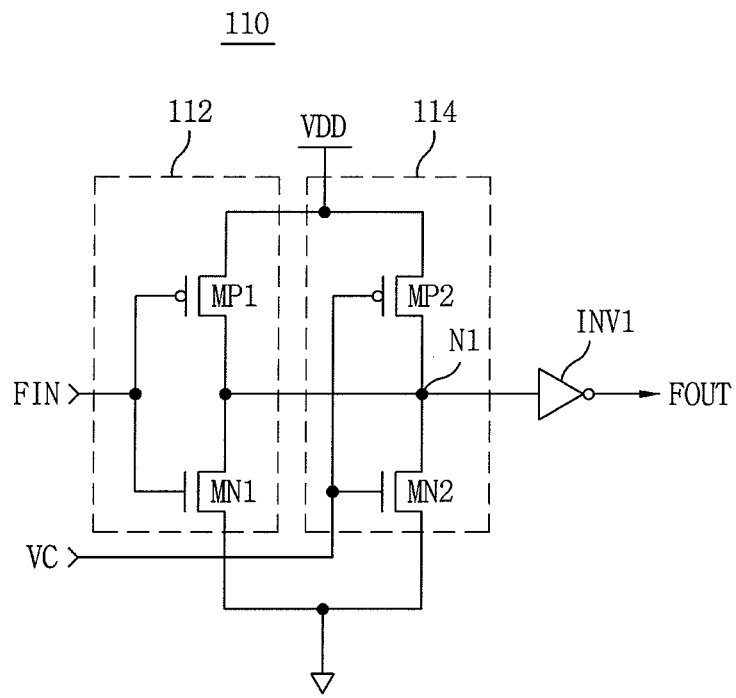
FIG. 2 is a circuit diagram of an exemplary duty steerer circuit included in the duty correcting circuit of FIG. 1.

FIG. 2 is a circuit diagram of an exemplary duty steerer circuit included in the duty correcting circuit of FIG. 1. Referring to FIG. 2, the duty steerer circuit 110 may include a driver 112 and a duty steerer 114.

The driver 112 may pull up or pull down an output node N1 in response to the input clock signal FIN. The duty steerer 114 may add an offset to a voltage signal of the output node N1 in response to the duty control signal VC.

The duty steerer 110 may increase or decrease a driving current of the output node N1 and steer a duty of the output clock signal FOUT. When a duty cycle of the input clock signal FIN is less than 50%, the duty steerer 110 may adjust the input clock signal FIN such that a rising edge of the output clock signal FOUT occurs at an earlier point in time and a falling edge of the output clock signal FOUT occurs at a later point in time. Also, when the duty cycle of the input clock signal FIN is more than 50%, the duty steerer 110 may adjust the input clock signal FIN such that the rising edge of the output clock signal FOUT occurs at later point in time and the falling edge of the output clock signal FOUT occurs at an earlier point in time.

The driver 112 may include a first PMOS transistor MP1 and a first NMOS transistor MN1. The first PMOS transistor MP1 may have a gate to which the input clock signal FIN is applied, a source connected to a power supply voltage VDD, and a drain connected to the output node N1. The first NMOS transistor MN1 may have a gate to which the input clock signal FIN is applied, a source connected to a ground voltage, and a drain connected to the output node N1.

The duty steerer 114 may include a second PMOS transistor MP2 and a second NMOS transistor MN2. The second PMOS transistor MP2 may have a gate to which the duty control signal VC is applied, a source connected to the power supply voltage VDD, and a drain connected to the output node N1. The second NMOS transistor MN2 may have a gate to which the duty control signal VC is applied, a source connected to the ground voltage, and a drain connected to the output node N1.

The duty steerer circuit 110 may further include an inverter INV1 configured to invert the phase of the voltage signal of the output node N1 and generate the output clock signal FOUT.

The duty steerer circuit 110 of FIG. 2 may operate within a wide range since the driver 112 and the duty steerer 114 are coupled in parallel between the power supply voltage VDD and the ground voltage.

Figure 3:
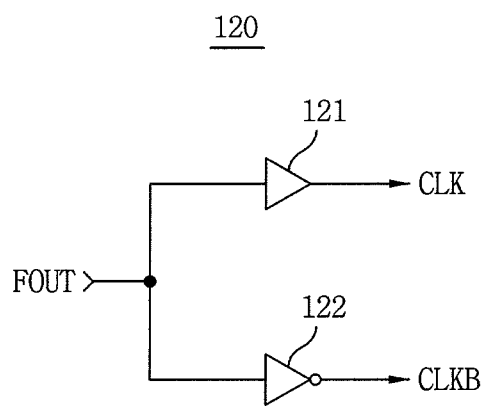
FIG. 3 is a circuit diagram of an exemplary differential clock generator included in the duty correcting circuit of FIG. 1.

FIG. 3 is a circuit diagram of an exemplary differential clock generator included in the duty correcting circuit of FIG. 1. Referring to FIG. 3, the differential clock generator 120 may include a buffer 121 and an inverter 122.

The buffer 121 may buffer the output clock signal FOUT and generate the first internal clock signal CLK, and the inverter 122 may invert the phase of the output clock signal FOUT and generate the second internal clock signal CLKB.

Figure 4:
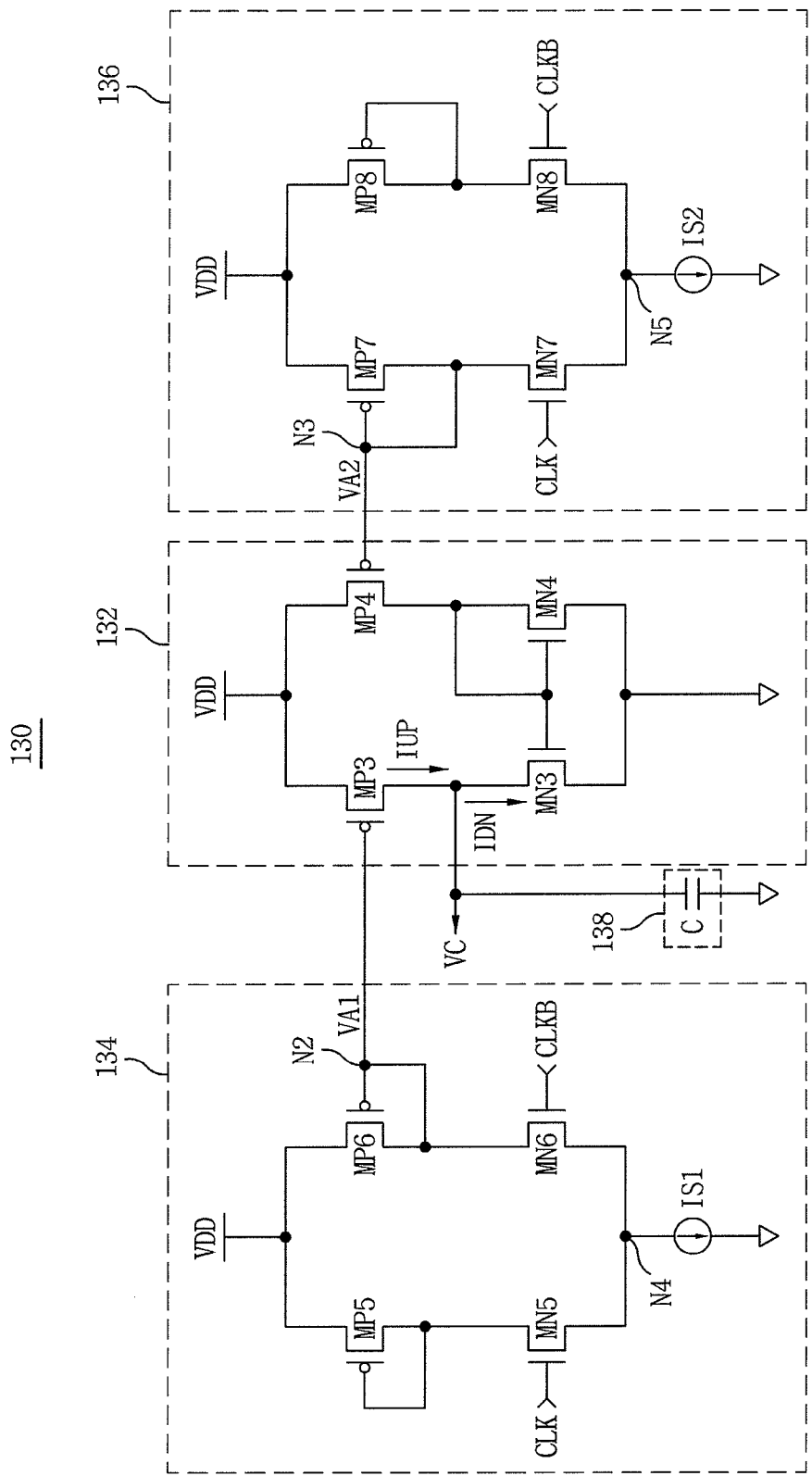
FIG. 4 is a circuit diagram of an exemplary charge pump circuit included in the duty correcting circuit of FIG. 1.

FIG. 4 is a circuit diagram of an exemplary charge pump circuit included in the duty correcting circuit of FIG. 1. Referring to FIG. 4, the charge pump circuit 130 may include a first differential amplifier 134, a second differential amplifier 136, a third differential amplifier 132, and a charge storage unit 138.

The first differential amplifier 134, which may have a positive voltage gain, may amplify a voltage difference between the first internal clock signal CLK and the second internal clock signal CLKB, generate a first amplified voltage signal VA1, and transmit the first amplified voltage signal VA1 to a second node N2. The second differential amplifier 136, which may have a negative voltage gain, may amplify the voltage difference between the first internal clock signal CLK and the second internal clock signal CLKB, generate a second amplified voltage signal VA2, and transmit the second amplified voltage signal VA2 to a third node N3. The third differential amplifier 132 may amplify the voltage difference between the first and second amplified voltage signals VA1 and VA2 and generate the duty control signal VC. The charge storage unit 138 may perform charge and discharge operations in response to the duty control signal VC and maintain a voltage level of the duty control signal VC. The charge storage unit 138 may include a capacitor C.

The first differential amplifier 134 may include a fifth PMOS transistor MP5, a sixth PMOS transistor MP6, a fifth NMOS transistor MN5, a sixth NMOS transistor MN6, and a current source IS1.

The fifth PMOS transistor MP5 may have a source connected to the power supply voltage VDD and a gate and drain connected to each other. The sixth PMOS transistor MP6 may have a source connected to the power supply voltage VDD, a gate connected to the second node N2, and a drain connected to the gate. The fifth NMOS transistor MN5 may have a gate to which the first internal clock signal CLK is applied, a drain connected to the drain of the fifth PMOS transistor MP5, and a source connected to the fourth node N4. The sixth NMOS transistor MN6 may have a gate to which the second internal clock signal CLKB is applied, a drain connected to the drain of the sixth PMOS transistor MP6, and a source connected to the fourth node N4. The current source IS1 may be coupled between the fourth node N4 and the ground voltage.

The second differential amplifier 136 may include a seventh PMOS transistor MP7, an eighth PMOS transistor MP8, a seventh NMOS transistor MN7, an eighth NMOS transistor MN8, and a current source IS2.

The seventh PMOS transistor MP7 may have a gate connected to node N3, a source connected to the power supply voltage VDD, and a drain connected to the gate. The eighth PMOS transistor MP8 may have a source connected to the power supply voltage VDD and a gate and drain connected to each other. The seventh NMOS transistor MN7 may have a gate to which the first internal clock signal CLK is applied, a drain connected to the drain of the seventh PMOS transistor MP7, and a source connected to a fifth node N5. The eighth NMOS transistor MN8 may have a gate to which the second internal clock signal CLKB is applied, a drain connected to the drain of the eighth PMOS transistor MP8, and a source connected to the fifth node N5. The current source IS2 may be coupled between the fifth node N5 and the ground voltage.

The third differential amplifier 132 may include a third PMOS transistor MP3, a fourth PMOS transistor MP4, a third NMOS transistor MN3, and a fourth NMOS transistor MN4.

The third PMOS transistor MP3 may have a source connected to the power supply voltage VDD, a gate connected to the second node N2, and a drain through which the duty control signal VC is output. The fourth PMOS transistor MP4 may have a source connected to the power supply voltage VDD and a gate connected to the third node N3. The third NMOS transistor MN3 may have a drain connected to the drain of the third PMOS transistor MP3 and a source connected to the ground voltage. The fourth NMOS transistor MN4 may have a gate and drain connected in common to the drain of the fourth PMOS transistor MP4 and a source connected to the ground voltage.

Hereinafter, an operation of the charge pump circuit 130 of FIG. 4 will be described according to an exemplary embodiment of the inventive concept.

For example, when the first internal clock signal CLK is at a logic high state and the second internal clock signal CLKB is at a logic low state, the first amplified voltage signal VA1 corresponding to a voltage of the second node N2 may have a logic high state, and the second amplified voltage signal VA2 corresponding to a voltage of the third node N3 may have a logic low state. Thus, the up current IUP flowing through the third PMOS transistor MP3 may be reduced, while the down current IDN flowing through the third NMOS transistor MN3 may be increased. As a result, charges stored in the capacitor C may be discharged through the third NMOS transistor MN3, and a voltage level of the duty control signal VC may be reduced. A reduction in the voltage level of the duty control signal VC may lead to a rise in the voltage level of the first node N1 of the duty steerer circuit 110 of FIG. 2 and a reduction in the voltage level of the output clock signal FOUT. Thus, the first internal clock signal CLK may enter a logic low state, and the second internal clock signal CLKB may enter a logic high state.

For example, when the first internal clock signal CLK is at a logic low state and the second internal clock signal CLKB is at a logic high state, the first amplified voltage signal VA1 corresponding to the voltage of the second node N2 may have a logic low state, and the second amplified voltage signal VA2 corresponding to the voltage of the third node N3 may have a logic high state. Thus, the up current IUP flowing through the third PMOS transistor MP3 may be increased, while the down current IDN flowing through the third NMOS transistor MN3 may be reduced. As a result, charges may be stored in the capacitor C, and the voltage level of the duty control signal VC may be increased. An increase in the voltage level of the duty control signal VC may lead to a reduction in the voltage level of the first node N1 of the duty steerer circuit 110 of FIG. 2 and an increase in the voltage level of the output clock signal FOUT. Thus, the first internal clock signal CLK may enter a logic high state, and the second internal clock signal CLKB may enter a logic low state.

The charge pump circuit 130 of FIG. 4 may repeat the above-described operation and have a duty cycle of 50% at a time point when the up current IUP becomes equal to the down current IDN.

In the charge pump circuit 130 of FIG. 4, since both the first internal clock signal CLK and the second internal clock signal CLKB are applied to the NMOS transistors, a mismatch between the PMOS and NMOS transistors should not occur.

Figure 5:
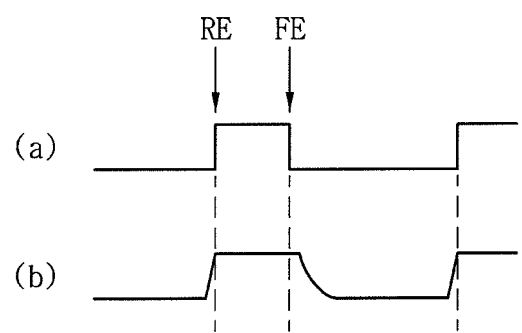
FIG. 5 is a timing diagram illustrating an exemplary operation of the duty correcting circuit of FIG. 1 when a duty cycle of a clock signal is less than 50%.

FIG. 5 is a timing diagram illustrating an exemplary operation of the duty correcting circuit of FIG. 1 when a clock signal has a duty cycle of less than 50%. Referring to FIG. 5, when the clock signal has a duty cycle of less than 50% (refer to (a) of FIG. 5), the duty correcting circuit 100 may adjust the clock signal such that a rising edge of an output clock signal FOUT occurs at an earlier point in time and a falling edge of the output clock signal FOUT occurs at a later point in time (refer to (b) of FIG. 5).

Figure 6:
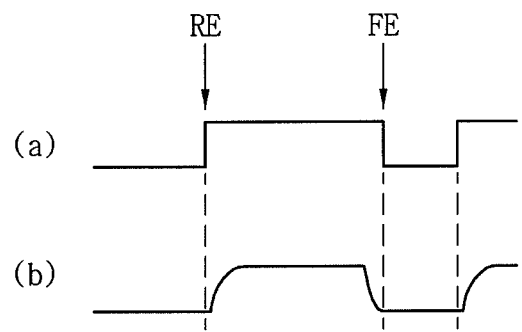
FIG. 6 is a timing diagram illustrating an exemplary operation of the duty correcting circuit of FIG. 1 when a duty cycle of a clock signal is more than 50%.

FIG. 6 is a timing diagram illustrating an exemplary operation of the duty correcting circuit of FIG. 1 when the clock signal has a duty cycle of more than 50%. Referring to FIG. 6, when the clock signal has a duty cycle of more than 50% (refer to (a) of FIG. 6), the duty correcting circuit 100 may adjust the clock signal such that the rising edge of the output clock signal FOUT occurs at a later point in time and the falling edge of the output clock signal FOUT occurs at an earlier point in time (refer to (b) of FIG. 6).

Figure 7:
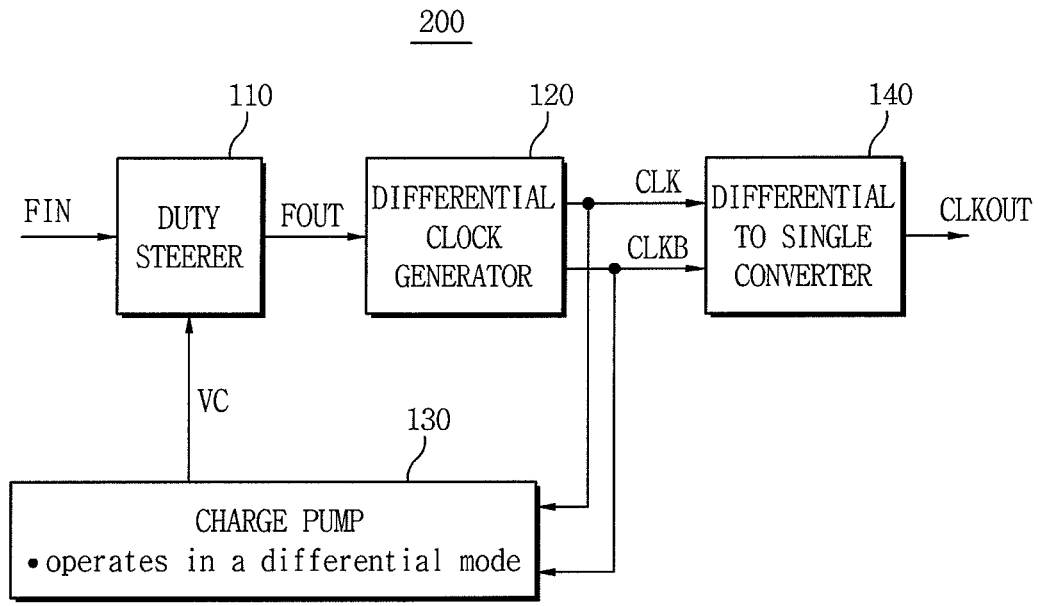
FIG. 7 is a block diagram of a duty correcting circuit according to an exemplary embodiment of the inventive concept.

FIG. 7 is a block diagram of a duty correcting circuit according to an exemplary embodiment of the inventive concept. Referring to FIG. 7, a duty correcting circuit 200 may include a duty steerer circuit 110, a differential clock generator 120, a charge pump circuit 130, and a differential-to-single converter 140.

The duty steerer circuit 110 may correct a duty cycle of an input clock signal FIN in response to a duty control signal VC and generate an output clock signal FOUT. The differential clock generator 120 may generate a first internal clock signal CLK and a second internal clock signal CLKB having a phase difference of 180° therebetween based on the output clock signal FOUT. The charge pump circuit 130 may perform a charge pump operation in a differential mode in response to the first internal clock signal CLK and the second internal clock signal CLKB to generate the duty control signal VC. The differential-to-single converter 140 may perform a differential-to-single conversion of the first and second internal clock signals CLK and CLKB to generate a third internal clock signal CLKOUT.

Figure 8:
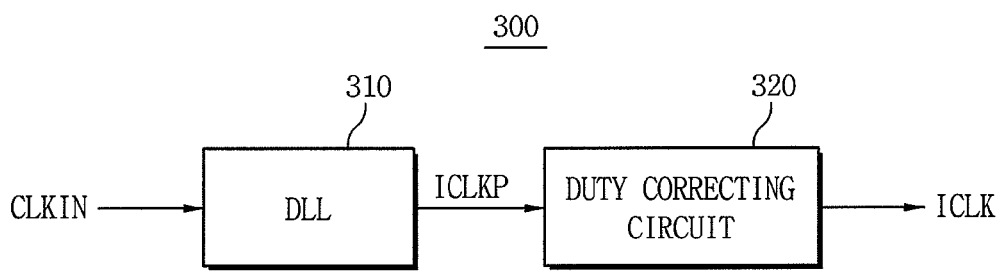
FIG. 8 is a block diagram of an exemplary DLL circuit including a duty correcting circuit according to an exemplary embodiment of the inventive concept.

The duty correcting circuit 200 of FIG. 7 may be used to output a single clock signal. FIG. 8 is a block diagram of an exemplary DLL circuit including a duty correcting circuit according to embodiments of the inventive concept.

Referring to FIG. 8, a DLL circuit 300 may include a DLL 310 and a duty correcting circuit 320. The DLL 310 may generate a first internal clock signal 1CLKP synchronized with an external clock signal, and the duty correcting circuit 320 may correct a duty cycle of the first internal clock signal ICLKP and be embodied by one of the duty correcting circuits discussed above according to embodiments of the inventive concept.

Figure 9:
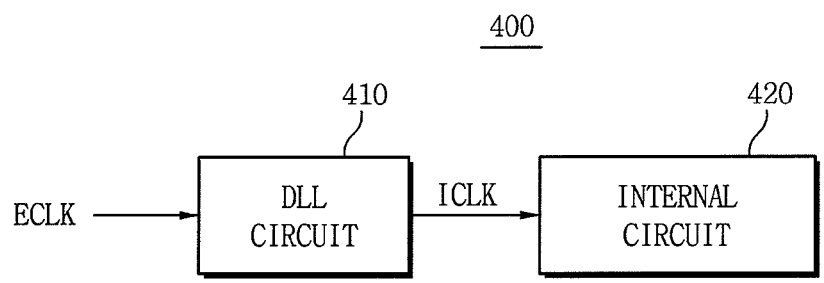
FIG. 9 is a block diagram of an exemplary semiconductor device including the DLL circuit of FIG. 8.

FIG. 9 is a block diagram of an exemplary semiconductor device including a DLL circuit of FIG. 8. Referring to FIG. 9, a semiconductor device 400 may include a DLL circuit 410 and an internal circuit 420. As an example, the internal circuit 420 could be a semiconductor memory having one or more memory cells (not shown), where a clock signal output by the DLL circuit 410 could be used to operate a logical circuit of the memory cells.

The DLL circuit 410, which may include a duty correcting circuit (e.g., 320), may be synchronized with an external clock signal and generate an internal clock signal having a corrected duty cycle. The internal circuit 420 may operate in response to the internal clock signal. The DLL circuit 410 may have a circuit configuration shown in FIG. 8.

A duty correcting circuit including a duty steerer circuit according to at least one embodiment of the inventive concept may control a delay time of a sampling clock signal in a digital mode based on a logic state of sampled data and detect a duty of an output clock signal. As a result, the duty correcting circuit according to at least the embodiment of the inventive concept may detect the duty of the output clock signal more precisely and generate an output clock signal having a duty cycle of 50% or substantially 50%.

Figure 10:
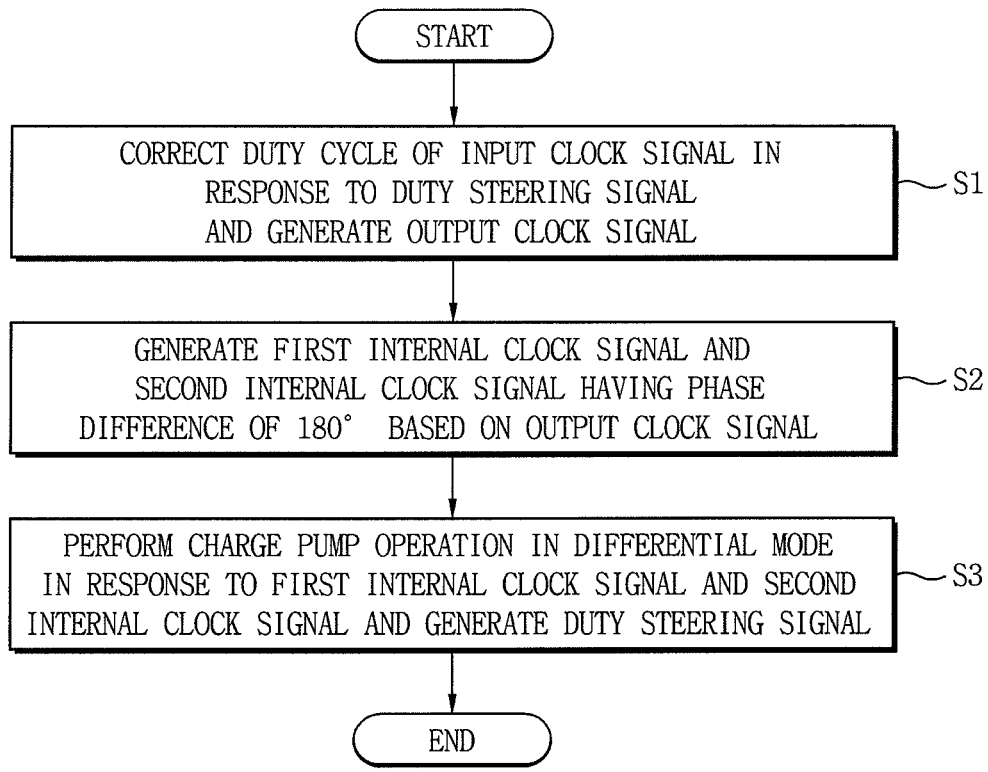
FIG. 10 is a flowchart illustrating a method of correcting a duty according to an exemplary embodiment of the inventive concept.

FIG. 10 is a flowchart illustrating a method of correcting a duty according to an exemplary embodiment of the inventive concept. Referring to FIG. 10, the method includes correcting a duty cycle of an input clock signal in response to a duty control signal to generate an output clock signal (S1), generating a first internal clock signal and a second internal clock signal having a phase difference of 180° therebetween based on the output clock signal (S2), and performing a charge pumping operation in a differential mode in response to the first internal clock signal and the second internal clock signal to generate the duty control signal (S3).

Figure 11:
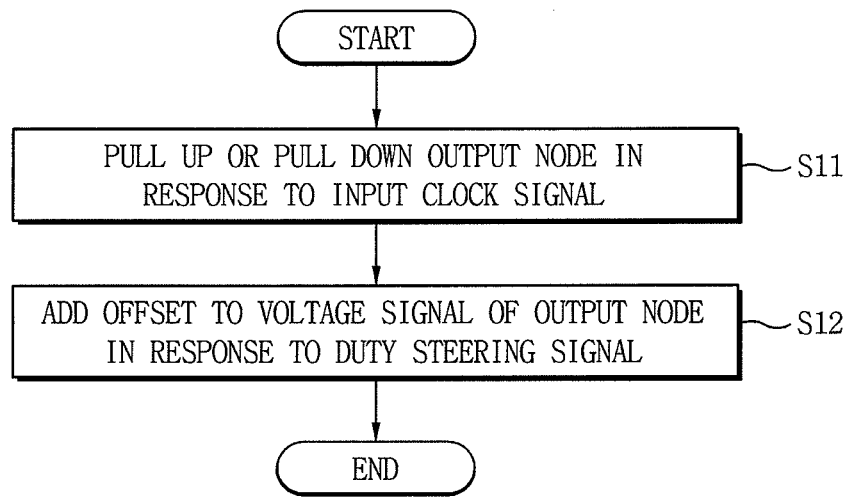
FIG. 11 is a flowchart illustrating a method of correcting a duty cycle of an input clock signal in the method of FIG. 10 according to an exemplary embodiment of the inventive concept.

FIG. 11 is a flowchart illustrating a method of correcting a duty cycle of an input clock signal in the method of FIG. 10 according to an exemplary embodiment of the inventive concept. Referring to FIG. 11, the method includes pulling up or down an output node in response to the input clock signal (S11) and adding an offset to a voltage signal of the output node in response to the duty control signal (S12).

Figure 12:
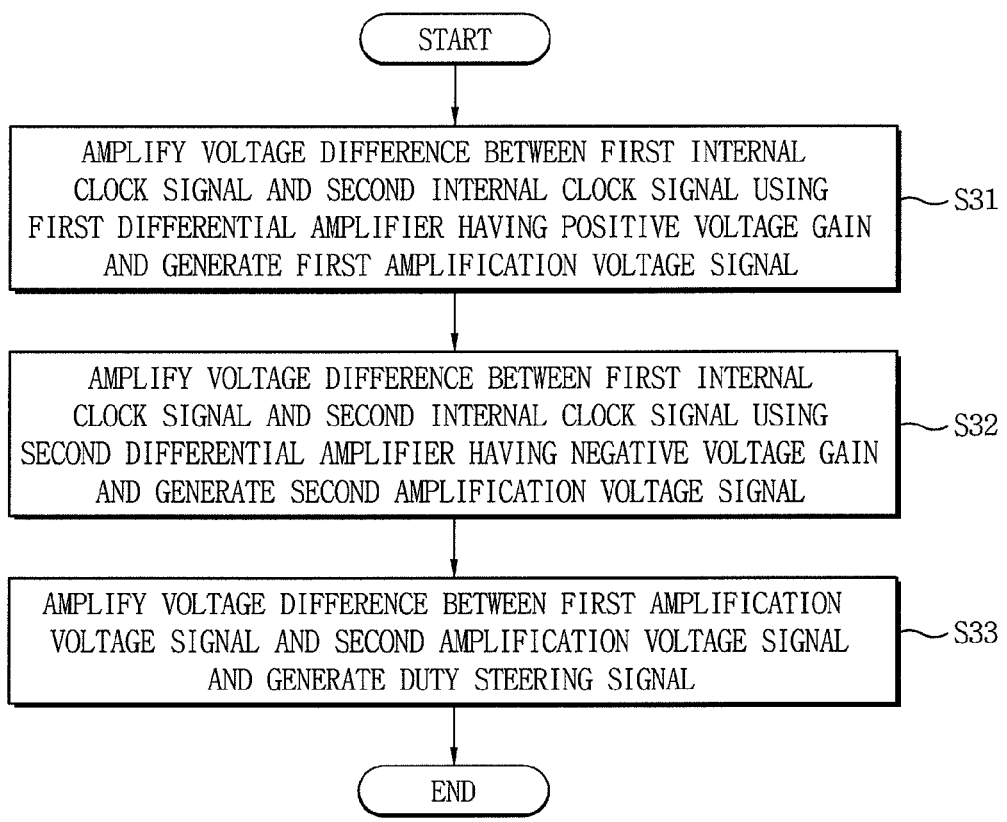
FIG. 12 is a flowchart illustrating a method of generating a duty control signal in the method of FIG. 10 according to an exemplary embodiment of the inventive concept.

FIG. 12 is a flowchart illustrating a method of generating the duty control signal in the method of FIG. 10 according to an exemplary embodiment of the inventive concept. Referring to FIG. 12, the method includes amplifying a voltage difference between the first internal clock signal and the second internal clock signal using a first differential amplifier having a positive voltage gain to generate a first amplified voltage signal (S31), amplifying the voltage difference between the first internal clock signal and the second internal clock signal using a second differential amplifier having a negative voltage gain to generate a second amplified voltage signal (S32), and amplifying the voltage difference between the first amplified voltage signal and the second amplified voltage signal to generate the duty control signal (S33).

Although a duty correcting circuit has been described above in conjunction with a DLL circuit, embodiments of the inventive concept are not limited thereto. For example, the duty correcting circuit may be used in conjunction with a phase-locked loop (PLL) circuit.

Embodiments of the inventive concept may be applied to a semiconductor device, particularly. For example, embodiments of the inventive concept may be applied to a clock generating circuit of a semiconductor device (e.g., a memory).

Since a duty correcting circuit according to at least one embodiment of the inventive concept includes a charge pumping circuit operating in a differential mode and a duty steerer circuit having a wide operation range, a mismatch between a PMOS transistor and an NMOS transistor may be prevented. Thus, a duty correcting circuit according to at least one embodiment of the inventive concept may more precisely correct a duty of an output clock signal. As a result, a semiconductor device including a duty correcting circuit according to at least one embodiment of the inventive concept may more precisely sample data irrespective of a fabrication process, an operation voltage, and an operation temperature.

While exemplary embodiments of the inventive concept have been described herein, it should be understood that other variations are possible.

What is claimed is:

1. A duty correcting circuit comprising:
a duty steerer circuit configured to correct a duty cycle of an input clock signal in response to a duty control signal to generate an output clock signal;
a differential clock generator configured to generate a first internal clock signal and a second internal clock signal having a phase difference of 180° from each other based on the output clock signal; and
a charge pump circuit configured to perform a charge pump operation in a differential mode in response to the first and second internal clock signals to generate the duty control signal,
wherein the charge pump circuit includes at least one differential amplifier configured to amplify a voltage difference between the first internal clock signal and the second internal clock signal.

2. The circuit of claim 1, wherein the duty correcting circuit maintains a duty of 50% when an up current flowing through a PMOS transistor of the charge pump is equal to a down current flowing through an NMOS transistor of the charge pump.

3. The circuit of claim 1, wherein the duty steerer circuit comprises:
a driver configured to pull up or pull down an output node of the duty steerer circuit in response to the input clock signal; and
a duty steerer configured to add an offset to a voltage signal of the output node in response to the duty control signal.

4. The circuit of claim 3, wherein the duty steerer increases or decreases a driving current of the output node to steer the duty cycle of the output clock signal.

5. The circuit of claim 3, wherein the duty steerer adjusts the input clock signal such that a rising edge of the output clock signal occurs at an earlier point in time and a falling edge of the output clock signal occurs at a later point in time, when the input clock signal has a duty cycle of less than 50%.

6. The circuit of claim 3, wherein the duty steerer adjusts the input clock signal such that a rising edge of the output clock signal occurs at a later point in time and a falling edge of the output clock signal occurs at an earlier point in time, when the input clock signal has a duty cycle of more than 50%.

7. The circuit of claim 3, wherein the driver comprises:
a PMOS transistor having a gate to which the input clock signal is applied, a source connected to a power supply voltage, and a drain connected to the output node; and
an NMOS transistor having a gate to which the input clock signal is applied, a source connected to a ground voltage, and a drain connected to the output node.

8. The circuit of claim 3, wherein the duty steerer comprises:
a PMOS transistor having a gate to which the duty control signal is applied, a source connected to a power supply voltage, and a drain connected to the output node; and
an NMOS transistor having a gate to which the duty control signal is applied, a source connected to a ground voltage, and a drain connected to the output node.

9. The circuit of claim 3, wherein the duty steerer circuit further comprises an inverter configured to invert a phase of the voltage signal of the output node to generate the output clock signal.

10. The circuit of claim 1, wherein the differential clock generator comprises:
a buffer configured to buffer the output clock signal to generate the first internal clock signal; and an inverter configured to invert a phase of the output clock signal to generate the second internal clock signal.

11. The circuit of claim 1, wherein the charge pump circuit comprises:
a first differential amplifier having a positive voltage gain and configured to amplify a voltage difference between the first internal clock signal and the second internal clock signal to generate a first amplified voltage signal, and transmit the first amplified voltage signal to a first node;
a second differential amplifier having a negative voltage gain and configured to amplify the voltage difference between the first internal clock signal and the second internal clock signal to generate a second amplified voltage signal, and transmit the second amplified voltage signal to a second node;
a third differential amplifier configured to amplify the voltage difference between the first amplified voltage signal and the second amplified voltage signal to generate the duty control signal; and
a charge storage unit configured to perform charge and discharge operations in response to the duty control signal.

12. The circuit of claim 11, wherein the charge storage unit includes a capacitor.

13. The circuit of claim 1, wherein the duty correcting circuit further comprises a differential-to-single converter configured to perform a differential-to-single conversion on the first internal clock signal and the second internal clock signal to generate a third internal clock signal.

14. A semiconductor device, comprising:
a logic circuit;
a duty steerer circuit configured to correct a duty cycle of an input clock signal in response to a duty control signal to generate a first internal clock signal;
a differential clock generator configured to generate a second internal clock signal and a third internal clock signal having a phase difference of 180° from each other based on the first internal clock signal;
a charge pump circuit configured to perform a charge pump operation in a differential mode in response to the second and third internal clock signals to generate the duty control signal; and
a differential-to-single converter configured to perform a differential-to-single conversion on the second internal clock signal and the third internal clock signal to generate a fourth internal clock signal and provide the fourth internal clock signal to the logic circuit.

15. The semiconductor device of claim 14, wherein the duty steerer adjusts the input clock signal such that a rising edge of the output clock signal occurs at an earlier point in time and a falling edge of the output clock signal occurs at a later point in time, when the input clock signal has a duty cycle of less than 50%, and wherein the duty steerer adjusts the input clock signal such that a rising edge of the output clock signal occurs at a later point in time and a falling edge of the output clock signal occurs at an earlier point in time, when the input clock signal has a duty cycle of more than 50%.

16. A method of correcting a duty cycle, comprising:
correcting a duty cycle of an input clock signal in response to a duty control signal to generate an output clock signal;
generating a first internal clock signal and a second internal clock signal having a phase difference of 180° from each other based on the output clock signal; and
performing a charge pumping operation in a differential mode in response to the first internal clock signal and the second internal clock signal to generate the duty control signal;
wherein the generating of the duty control signal comprises performing at least one amplification of a voltage difference between the first internal clock signal and the second internal clock signal.

17. The method of claim 16, wherein correcting the duty cycle of the input clock signal comprises:
pulling up or pulling down an output node in response to the input clock signal; and
adding an offset to a voltage signal of the output node in response to the duty control signal.

18. The method of claim 16, wherein the correcting comprises adjusting the input clock signal such that a rising edge of the output clock signal occurs at an earlier point in time, and a falling edge of the output clock signal occurs at a later point in time when the input clock signal has a duty cycle of less than 50%.

19. The method of claim 16, wherein the correcting comprises adjusting the input clock signal such that a rising edge of the output clock signal occurs at a later point in time, and a falling edge of the output clock signal occurs at an earlier point in time when the input clock signal has a duty cycle of more than 50%.

20. The method of claim 16, wherein generating the duty control signal comprises:
amplifying a voltage difference between the first internal clock signal and the second internal clock signal to generate a first amplified voltage signal using a first differential amplifier having a positive voltage gain;
amplifying the voltage difference between the first internal clock signal and the second internal clock signal to generate a second amplified voltage signal using a second differential amplifier having a negative voltage gain; and
amplifying a voltage difference between the first amplified voltage signal and the second amplified voltage signal to generate the duty control signal.

* * * * *